United States Patent
Han

(10) Patent No.: US 9,515,296 B2
(45) Date of Patent: Dec. 6, 2016

(54) DEPOSITION DEVICE INCLUDING LASER MASK AND DEPOSITION METHOD USING THE SAME

(71) Applicant: Samsung Display Co., Ltd., Yongin-si (KR)

(72) Inventor: Jeongwon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/943,619

(22) Filed: Nov. 17, 2015

(65) Prior Publication Data

US 2016/0301036 A1    Oct. 13, 2016

(30) Foreign Application Priority Data

Apr. 7, 2015   (KR) .................. 10-2015-0049080

(51) Int. Cl.
| | | |
|---|---|---|
| H01L 21/00 | (2006.01) | |
| H01L 51/56 | (2006.01) | |
| H01L 51/00 | (2006.01) | |
| C23C 16/48 | (2006.01) | |

(52) U.S. Cl.
CPC ............ H01L 51/56 (2013.01); C23C 16/483 (2013.01); H01L 51/0009 (2013.01); H01L 51/0011 (2013.01)

(58) Field of Classification Search
None
See application file for complete search history.

(56) References Cited

U.S. PATENT DOCUMENTS

2007/0190235 A1*  8/2007  Yamazaki ............ H01L 51/001
                                                     427/64
2014/0238963 A1*  8/2014  Jo ...................... B23K 26/127
                                                     219/121.77

FOREIGN PATENT DOCUMENTS

| KR | 10-2005-0035561 | 4/2005 |
|---|---|---|
| KR | 10-2006-0115070 | 11/2006 |
| KR | 10-2007-0024867 | 3/2007 |
| KR | 10-2009-0053417 | 5/2009 |
| KR | 10-2009-0105614 | 10/2009 |
| KR | 10-2011-0060373 | 6/2011 |
| KR | 10-2012-0081480 | 7/2012 |
| KR | 10-2013-0039021 | 4/2013 |

* cited by examiner

*Primary Examiner* — Angel Roman
(74) *Attorney, Agent, or Firm* — H.C. Park & Associates, PLC

(57) ABSTRACT

A deposition device including a chamber configured to accommodate a substrate supported on a stage, a deposition source configured to discharge material toward the substrate, and a laser mask system configured to form a laser mask between the substrate and the stage.

20 Claims, 7 Drawing Sheets

DEPOSITION DEVICE INCLUDING LASER MASK AND DEPOSITION METHOD USING THE SAME

CROSS-REFERENCE TO RELATED APPLICATION

This application claims priority from and the benefit of Korean Patent Application No. 10-2015-0049080, filed on Apr. 7, 2015, which is hereby incorporated by reference for all purposes as if fully set forth herein.

BACKGROUND

Field

Exemplary embodiments relate to an evaporation device for an organic light-emitting display apparatus and an evaporation method using the same.

Discussion of the Background

Organic light-emitting displays are used in electronic devices, such as smart phones, tablets, personal computers, laptop computers, digital cameras, camcorders, televisions, and billboards. The organic light-emitting displays typically include an anode, a cathode, and an organic light-emitting layer disposed between the anode and the cathode. Traditional methods of forming organic light-emitting displays may include use of a metal mask and metal plate in association with a mask assembly. Use of such metal masks and plates increase manufacturing costs of the mask assembly, and, thereby, the costs of the organic light-emitting displays. The metal masks and/or metal plates may be welded to the mask assembly, and, as such, welding equipment may be stored onsite. The welded metal masks and plates may also complicate the washing process of the mask assemblies.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an evaporation device for an organic light-emitting display apparatus and an evaporation method using the same.

Additional aspects will be set forth in the detailed description which follows, and, in part, will be apparent from the disclosure, or may be learned by practice of the inventive concept.

According to one or more exemplary embodiments a deposition device including a chamber configured to accommodate a substrate supported on a stage, a deposition source configured to discharge material toward the substrate, and a laser mask system configured to form a laser mask between the substrate and the stage.

According to one or more exemplary embodiments a method including causing, at least in part, a laser mask to be formed between a substrate and a stage in a deposition chamber, the stage supporting the substrate, and causing, at least in part, a deposition material to be discharged from a deposition source toward the substrate. The deposition material is deposited on the substrate according to a configuration of the laser mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
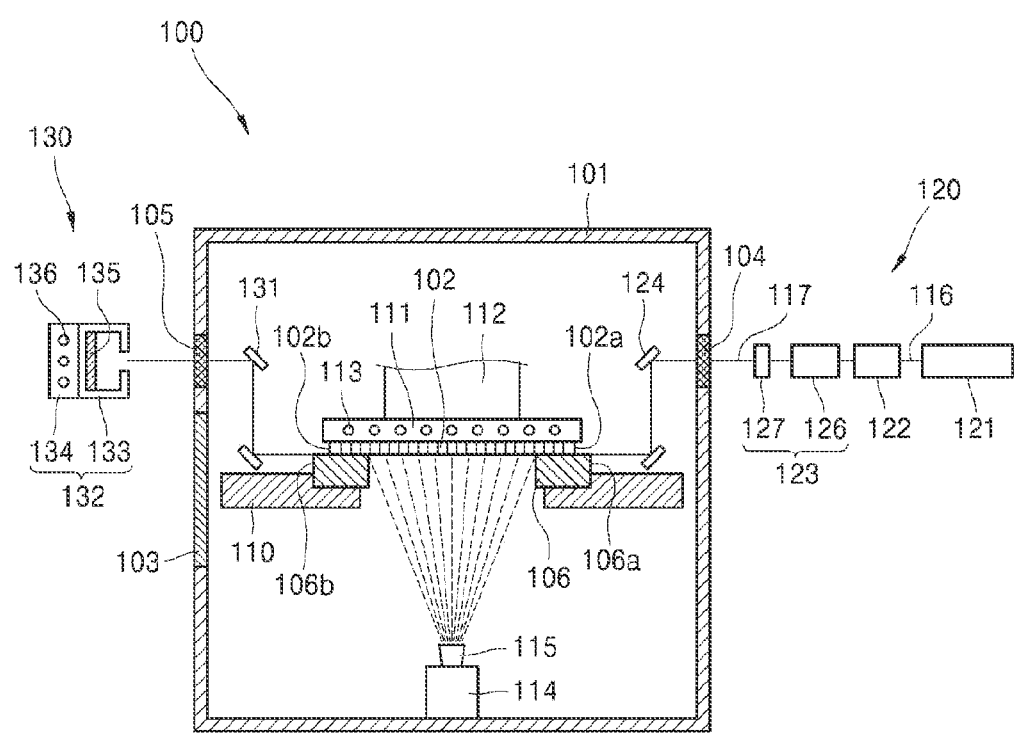
FIG. 1 is a view of an evaporation device according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to formation of organic light emitting display devices, it is contemplated that various exemplary embodiments are also applicable to other display devices, such as, liquid crystal displays, plasma displays, field emission displays, electrophoretic displays, electrowetting displays, and the like, as well as the general deposition of material on a substrate (or other underlying layer).

Figure 2:
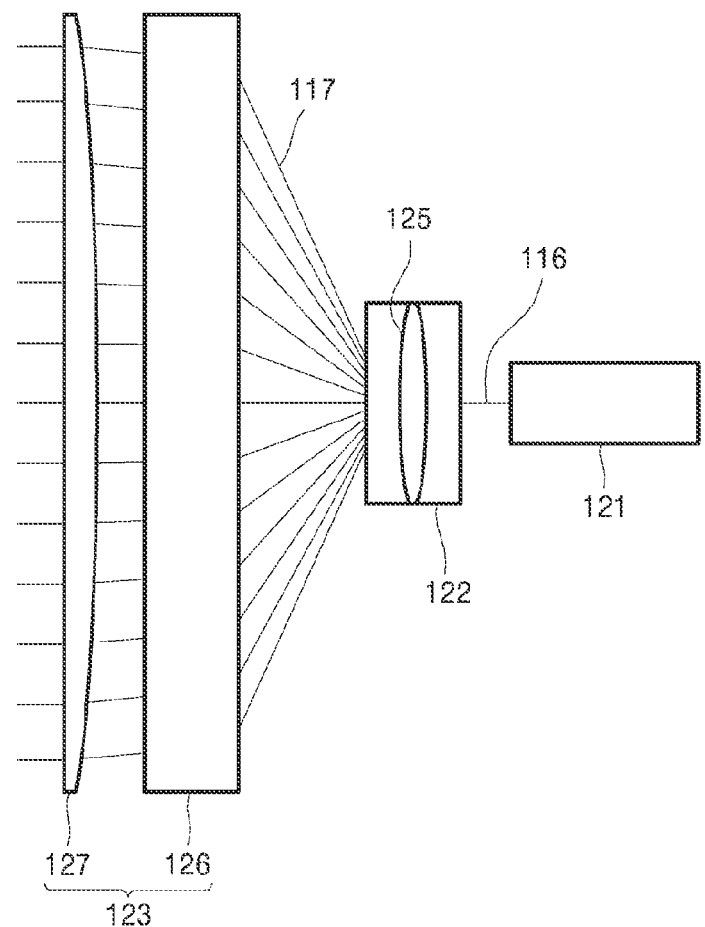
FIG. 2 is a view of a laser mask system of the evaporation device of FIG. 1 according to one or more exemplary embodiments.
Figure 3:
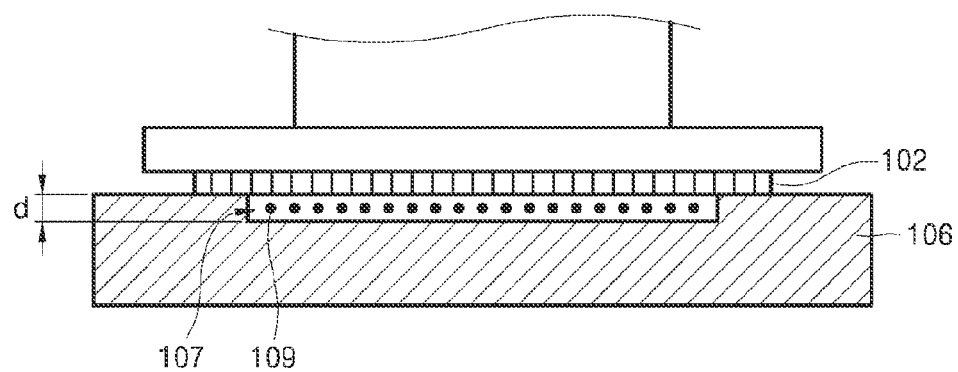
FIG. 3 is a view of a laser beam incident between a substrate and a substrate stage of the evaporation device of FIG. 1 according to one or more exemplary embodiments.

FIG. 1 is a view of an evaporation device for an organic light-emitting display apparatus according to one or more exemplary embodiments. FIG. 2 is a view of a laser mask system of the evaporation device of FIG. 1 according to one or more exemplary embodiment. FIG. 3 is a view of a laser beam incident between a substrate and a substrate stage of the evaporation device of FIG. 1 according to one or more exemplary embodiments.

Referring to FIGS. 1, 2, and 3, the evaporation device 100 may include a chamber 101. The chamber 101 may separate a reaction space from an external environment. In one or more exemplary embodiments, the chamber 101 maintains a pressurized environment, e.g., a certain degree of negative pressure (such as a vacuum), to improve the uniformity of deposition, such as to provide straightness to a deposition material.

The chamber 101 may include an inlet 103 disposed on a side wall of the chamber 101 to charge the substrate 102 inside the chamber 101. The location or size of the inlet 103 is not limited to the location and relative size as shown in FIG. 1. In terms of location, the inlet 103 may be on any side wall (e.g., an opposite side wall as shown or another side wall not shown), top wall, or bottom wall of the chamber 101. In terms of size, the inlet 104 may be larger or smaller than the relative size shown in FIG. 1.

The chamber 101 may include chamber windows disposed on a wall (e.g., the side wall) of the chamber 101. For example, the chamber 101 may include a first chamber window 104 formed on a side wall of the chamber 101 and a second chamber window 105 formed on a different side wall of the chamber 101 than the first chamber window 104. A location or size of the chamber windows is not limited to those illustrated in FIG. 1. In terms of location, one or more of the first and second chamber windows 104 and 105 may be on the same side wall, the top wall, or the bottom wall. In terms of size, the first and second chamber windows 104 and 105 may be the same size, different sizes, and/or larger or smaller than the relative sizes shown in FIG. 1. The first and second chamber windows 104 and 105 may include quartz.

The substrate 102 may be disposed at an upper portion inside the chamber 101. However, the substrate 102 is not limited to being disposed at an upper portion inside the chamber 101. The substrate 102 may disposed at a lower portion, middle portion, or side portion inside the chamber 101. In addition, the substrate 102 may be disposed on another object (e.g., a transportation support object, such as a moveable substrate stage 106) outside the chamber 101 and subsequently placed in the chamber 101.

The substrate 102 is an object having a deposition area (or target area). In association with exemplary embodiments described herein, the substrate 102 may include glass, polymer resin, or a polymer film. It is contemplated, however, that substrate 102 may be formed of any suitable material. The polymer film or polymer resin may have flexibility. In one or more exemplary embodiments, an organic light-emitting layer may be disposed on the deposition area of the substrate 102.

The substrate 102 may be disposed on the substrate stage 106. The substrate 102 may be mounted on the substrate stage 106 so that the substrate stage 106 supports the substrate 102. The substrate stage 106 may move in one or more degrees of freedom. For instance, in a Cartesian coordinate system, the substrate stage 106 may translate along an X axis, a Y axis, and/or a Z axis, and/or rotate about the X axis, Y axis, and/or Z axis.

As shown in FIG. 3, the substrate 102 and the substrate stage 106 may have a distance (or spacing) "d" between the substrate and the substrate stage 106. The distance "d" may correspond to a groove 107 formed in a surface (e.g., a top surface) of the substrate stage 106 facing the substrate 102. A laser mask 109 (FIG. 3) formed by multiple laser beams 117 (FIG. 2) may propagate in association with the groove 107, as will become more apparent below.

The groove 107 may extend between a first side 106a of the substrate stage 106 and a second side 106b of the substrate stage 106. The second side 106b is opposite the first side 106a. The first side 106a corresponds to an area in which the multiple laser beams 117 are incident and the second side 106b corresponds to an area from which the multiple laser beams 117 exit. The groove 107 may have a size that is greater than the deposition area of the substrate 102. For instance, in a plan view, the surface area of the groove 107 may be greater than the surface area of the deposition area.

Figure 4:
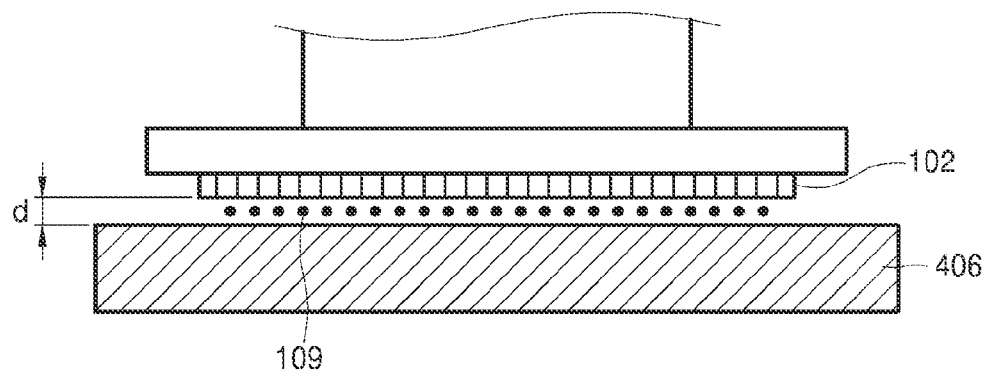
FIG. 4 is a view of a support portion of the evaporation device of FIG. 1 according to one or more exemplary embodiments.

FIG. 4 is a view of a support portion of the evaporation device of FIG. 1 according to one or more exemplary embodiments. As shown, the distance "d" may be constant between the substrate 102 and the substrate stage 406 without forming the groove 107 in the substrate stage 106 of FIG. 3. It is also contemplated that the distance "d" may be variable across in a length and/or width direction. The laser mask 109 to be formed by the multiple laser beams 117 may be disposed in the distance "d." Referring back to FIGS. 1 to 3, the substrate stage 406 (like substrate stage 106) may be connected to a stage holder 110 supported in chamber 101.

A support 111 may be disposed on the substrate 102 to support the substrate 102 on the substrate stage 106. The support 111 may pressurize the substrate 102 and may include a cooling plate (or portion) to prevent the substrate 102 from overheating during a laser process. In other words, the cooling plate of the support 111 may maintain the temperature of the substrate or help reduce the temperature of the substrate during a laser process. For example, a temperature of the cooling plate may be controlled (e.g., statically, variably, and dynamically) to prevent a temperature of the substrate 102 from reaching a threshold value (or range). The support 111 may be connected to a drive axis 112 so that the support 111 may contact a rear surface of the substrate 102 by an up and down motion of the drive axis 112. The support 111 may include a cooling path 113 to circulate a coolant. The coolant (in a liquid phase or a gas phase) may circulate through the cooling path 113 to control a temperature of the substrate 102.

Figure 5:
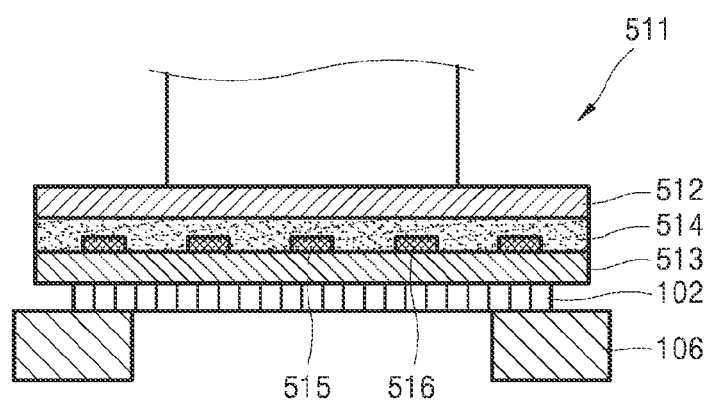
FIG. 5 is a view of a support portion of an evaporation device according to one or more exemplary embodiments.

FIG. 5 is a view of a support portion of an evaporation device according to one or more exemplary embodiments. As shown in FIG. 5, a support 511 may be an electrostatic chuck to electrostatically hold the substrate 102 according to an electrostatic force. For example, the support 511 may include a first dielectric layer 512, a second dielectric layer 513, and first and second electrodes 515 and 516 between the first dielectric layer 512 and the second dielectric layer 513. The first and second dielectric layers 512 and 513 may include an insulation material, e.g., a polymer film. The first and second dielectric layers 512 and 513 may be attached to each other using an insulating adhesive 514.

The first electrode 515 and the second electrode 516 may be arranged between the first dielectric layer 512 and the second dielectric layer 513. The first electrode 515 and the second electrode 516 may be bipolar-type electrodes. Voltages with different polarities may be applied through the first electrode 515 and the second electrode 516. In one or more exemplary embodiments, the first electrode 515 and the second electrode 516 may be unipolar-type electrodes. Although not illustrated, the first electrode 515 and the second electrode 516 may have a wavy strip shape. When electrical power is supplied to the first electrode 515 and the second electrode 516, the support 511 may be detachably coupled to the rear surface of the substrate 102 according to an electrostatic force.

Referring back to FIGS. 1 to 3, a crucible 114 (i.e., a deposition source) or any other suitable deposition source may be supported in the chamber 110, e.g., disposed on the bottom of the chamber 110. The crucible 114 may contain a deposition material. The deposition material may be ejected through a nozzle 115. For instance, the crucible 114 may be heated to evaporate (or sublimate) the deposition material. When the deposition material evaporates, the evaporated deposition material may be emitted (or otherwise discharged) toward the substrate 102.

The laser mask system 120 may be disposed at a first side of the substrate 102. The laser mask 109 may be formed using the multiple laser beams 117 that are radiated toward (or propagate along) the substrate 102. The laser mask system 120 may include a laser source 121, a multi-beam generator 122, a lens unit 123, and mirrors 124. The laser source 121 may emit a single laser beam 116. The laser source 121 may be a solid state laser, such as a ruby laser, a glass laser, an yttrium aluminum garnet (YAG) laser, an yttrium lithium fluoride (YLF) laser, a gas laser (e.g., an excimer laser and a helium-neon laser), a pulsed laser, etc.

Referring to FIG. 2, the multi-beam generator 122 may split the single laser beam 116 emitted from the laser source 121 by a desired amount. For example, the multi-beam generator 122 may include a diffractive optical element 125 to diffract the single laser beam 116 into the multiple laser beams 117. For example, the diffractive optical element 125 may be rotated about an optical axis to control an interval (or separation distance) between the multiple laser beams 117. The interval may be further controlled by adjusting a rotation angle of the diffractive optical element 125. The diffractive optical element 125 may include a structure (e.g., one or more slits) to split a collimated laser beam 116 into the multiple laser beams 117 of multiple lines having different angles of propagation from the multi-beam generator 122.

The lens unit 123 may include a first lens portion 126 including at least one lens and a second lens portion 127 including at least one lens. The lens unit 123 may focus (or redirect) the multiple laser beams 117 split by the multi-beam generator 122 to correspond to a desired size and arrangement for masking the deposition material. The lens unit 123 may configure the lenses to change the paths of the multiple laser beams 117 to parallel laser beam paths. For example, the first lens portion 126 and the second lens portion 127 may include a combination of various lenses (e.g., a collimating lens to form the multiple laser beams 117 as parallel beams, a focusing lens to focus the multiple laser beams 117, and/or an f-O lens) to provide (or maintain) the linearity of the multiple laser beams 117. However, exemplary embodiments are not so limited. Any type of lens and/or number of lenses may be used. In addition, a cylindrical lens, a spherical aberration correction lens, a toric lens, and/or a scanning optical lens may be selectively used to configure the multiple laser beams 117 to a determined size and to convert the multiple laser beams 117 to parallel beams.

The mirrors 124 may be disposed in a path of the multiple laser beams 117. For instance, the mirrors 124 may direct the path of the multiple laser beams 117 to control the multiple laser beams 117 propagation into the chamber 101 and between the substrate 102 and the substrate stage 106. As seen in FIG. 1, the multiple laser beams 117 may pass between the substrate 102 and the substrate stage 106 and may proceed from the first side 102a of the substrate 102 to the second side 102b of the substrate 102 due to the redirection of the multiple laser beams 117 from the mirrors 124. Although the mirrors 124 are shown in the chamber 101, it is contemplated that the mirrors 124 may be disposed outside the chamber to avoid temperature dependent aberrations associated with the redirection of the multiple laser beams 117. In one or more exemplary embodiments, an entire width of the multiple laser beams 117 may correspond to a width of the deposition area of the substrate 102.

Figure 6:
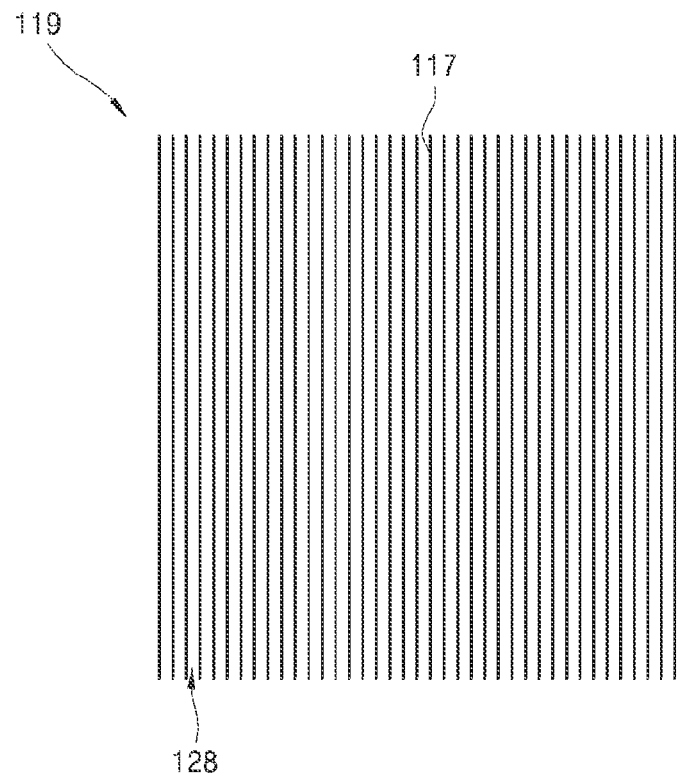
FIG. 6 is a view of a laser mask of the evaporation device of FIG. 1 according to one or more exemplary embodiments.

FIG. 6 is a view of a laser mask formed of the evaporation device of FIG. 1 according to one or more exemplary embodiments. As shown in FIG. 6, a laser mask 119 may be formed between the substrate 102 and the substrate stage 106 according to an arrangement of the multiple laser beams 117. For example, a pattern of the laser mask 119 formed by the multiple laser beams 117 may have a stripe shape. The deposition material discharged from the crucible 114 of FIG. 1 may be deposited in a desired deposition area of the substrate 102 according to the spaces 128 of the laser mask 119. However, when the deposition material (e.g., an organic material) collides with the multiple laser beams 117, a molecular chain of the organic material may be broken. This may cause, at least in part, a pattern to be formed on the substrate 102.

Figure 7:
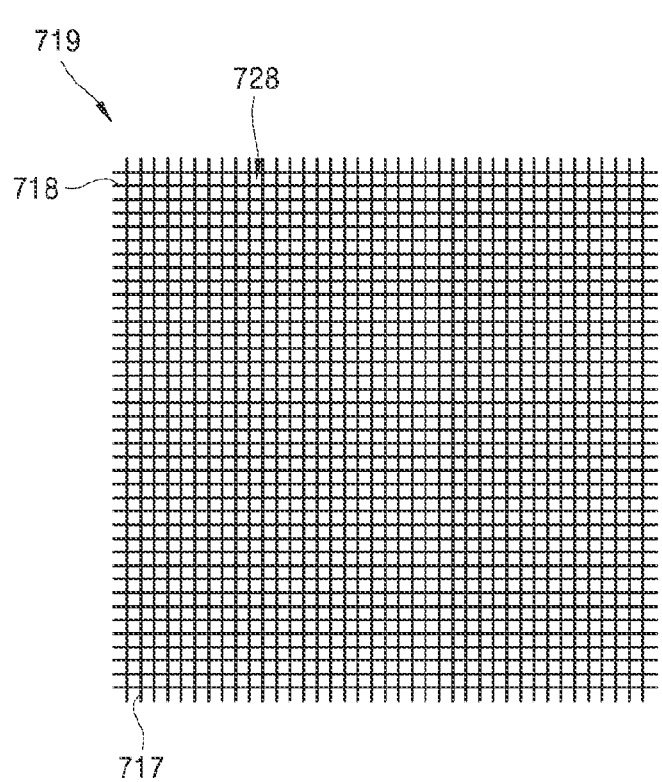
FIG. 7 is a view of a laser mask of an evaporation device according to one or more exemplary embodiments.

FIG. 7 is a plan view of a laser mask formed in an evaporation device according to one or more exemplary embodiments. As shown in FIG. 7, a laser mask 719 may be formed as a mesh shape. For instance, the laser mask system 120 of FIG. 1 is provided to generate first multi-laser beams 717 and second multi-laser beams 718, such that the first multi-laser beams 717 are radiated from the first side 102a of the substrate 102 to the second side 102b of the substrate 102, and the second multi-laser beam 718 are radiated from a third side (not illustrated) of the substrate 102 crossing the first side 102a of the substrate 102 to a fourth side (not illustrated) of the substrate 102 that is opposite the third side of the substrate 102. The first multi-laser beams 717 and the second multi-laser beams 718 may cross each other. The deposition material discharged from the crucible 114 of FIG. 1 may be deposited on in the deposition area of the substrate 102 according to the spaces 728 of the laser mask 719.

Referring back to FIGS. 1 to 3, a laser-absorbing system 130 may be disposed at another side of the substrate 102, which may oppose the laser source 121. The laser-absorbing system 130 may absorb the multiple laser beams 117 having passed between the substrate 102 and the substrate stage 106. The laser-absorbing system 130 may include mirrors 131 and a laser-absorbing unit 132. The mirrors 131 may direct a path of the multiple laser beams 117 having passed between the substrate 102 and the substrate stage 106. Although the mirrors 131 are shown in the chamber 101, it is contemplated that the mirrors 131 may be disposed outside the chamber to avoid temperature dependent aberrations associated with the redirection of the multiple laser beams 117.

The laser-absorbing unit 132 may absorb the multiple laser beams 117 exiting from the second chamber window 105 formed in the chamber 101. The laser-absorbing unit 132 may include a housing 133. An absorber 135 may be provided in the housing 133. The multiple laser beams 117 may be absorbed by the absorber 135. A cooling portion 134 may be installed at a side of the housing 133. Cooling channels 136 may be disposed in the cooling portion 134. A cooling medium may flow through the cooling channels 136. The cooling medium may be water or any other type of coolant. The cooling portion 134 may cool the housing 133 heated by the absorbed multiple laser beams 117.

Although not illustrated, a controller may be utilized to control various aspects of the evaporation device 100. For instance, the controller may be configured to control evaporation conditions in the chamber 101, laser mask formation via laser mask system 120, laser absorption via laser-absorbing system 130, deposition material discharge via crucible 115, substrate arrangement via substrate stage 106, and the like. As such, the various components of the evaporation device (including the controller) may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, etc. To this end, the laser mask system 120, the laser-absorbing system 130, the substrate stage 106, etc., and/or one or more components thereof, may be associated with one or more controllable features, such as actuators, motors, pumps, etc., to enable the evaporation device 100 to be controlled before, during, and/or after a formation process.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the evaporation device 100 may include or otherwise be associated with one or more memories (not shown) including code (e.g., instructions) configured to cause one or more components of the evaporation device 100 to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

A deposition method using the deposition device 100 for an organic light-emitting display apparatus having the above configuration will be explained with reference to FIGS. 1 to 4.

The substrate 102 may be mounted on the substrate stage 106 in the chamber 101. The deposition material may be disposed in the deposition area of the substrate 102. For example, a raw material for an organic light-emitting layer of an organic light-emitting display device (OLED) may be deposited in the deposition area of the substrate 102.

The distance "d" may be provided between the substrate 102 and the substrate stage 106. In one or more exemplary embodiments, the distance "d" may be a groove 107 formed in the substrate stage 106 to face the substrate 102.

A support portion 111 may be disposed on the substrate 102. The support portion 111 may be a cooling plate that pressurizes the substrate 102 and controls a temperature of the substrate 102, and/or an electrostatic chuck that holds the substrate 102 using an electrostatic force.

The single laser beam 116 may be radiated toward the substrate 102 mounted on the substrate stage 106 to form the laser mask 119 between the substrate 102 and the substrate stage 106. The single laser beam 116 is generated by the laser source 121. When the single laser beam 116 passes through the multi-beam generator 122, the single laser beam 116 may be split into a number of beams corresponding to the laser mask 119. The multi-beam generator 122 may include the diffraction optical elements 125 to diffract the single laser beam 116 into the multiple laser beams 117.

The multiple laser beams 117 may pass through the first and second lens portions 126 and 127, and the multiple laser beams 117 may be focused (or otherwise redirected) to correspond to the deposition area on the substrate 102. For example, the first lens portion 126 and the second lens portion 127 may focus the multiple laser beams 117 split by the multi-beam generator 122 to correspond to the masking of the deposition material. The first lens portion 126 and the second lens portion 127 may focus the multiple laser beams 117 to create parallel multiple laser beams 117; however, any other suitable mask pattern may be utilized in association with exemplary embodiments described herein.

The laser mask 119 is formed by the multiple laser beams 117 proceeding between the substrate 102 and the substrate stage 106. For example, the multiple laser beams 117 may form the laser mask 119 having the stripe shape by preceding from the first side 102a of the substrate 102 the second side 102b that is opposite the first side 102a. In one or more exemplary embodiments, multiple laser mask systems 120 may be provided to form the laser mask 719 of a mesh shape or any other shape.

The laser mask 119 may be disposed in the groove 107 of the substrate stage 106. The spaces of the laser mask 119 may substantially correspond to the areas of deposition in the deposition area of the substrate 102. The entire width of the multiple laser beams 117 may correspond to the deposition area of the substrate 102.

After the laser mask 119 is formed, the deposition material may be discharged from the crucible 114 mounted on the bottom of the chamber 101. It is contemplated, however, that the deposition material may be discharged as the laser mask 119 is being formed. In this manner, the deposition material may reach the laser mask 119 after the laser mask 119 is formed. The deposition material discharged from the nozzle 115 of the crucible 114 may pass through the spaces of the laser mask 119 to be deposited on the deposition area of the substrate 102. However, when the deposition material collides with the laser mask 119, a molecule chain of the deposition material may be broken and the deposition material with the broken molecule chain may evaporate and be removed by a collection apparatus (not illustrated).

The multiple laser beams 117 may be absorbed by the laser-absorbing system 130. For instance, the path of the multiple laser beams 117 having passed between the substrate 102 and the substrate stage 106 may be directed by the mirrors 131. The multiple laser beams 117 may propagate through the second chamber window 105 installed on the chamber 101. In this manner, the multiple laser beams 117 may be absorbed by the absorber 135 provided in the housing 133. The housing 133, which may be heated by the multiple laser beams 117 being absorbed, may be cooled by the cooling portion 134. As such, a deposition pattern may be formed on the substrate 102 using the laser mask system 120 and the laser-absorbing system 130 without a mask assembly including a metal mask and a mask frame supporting the metal mask.

Figure 8:
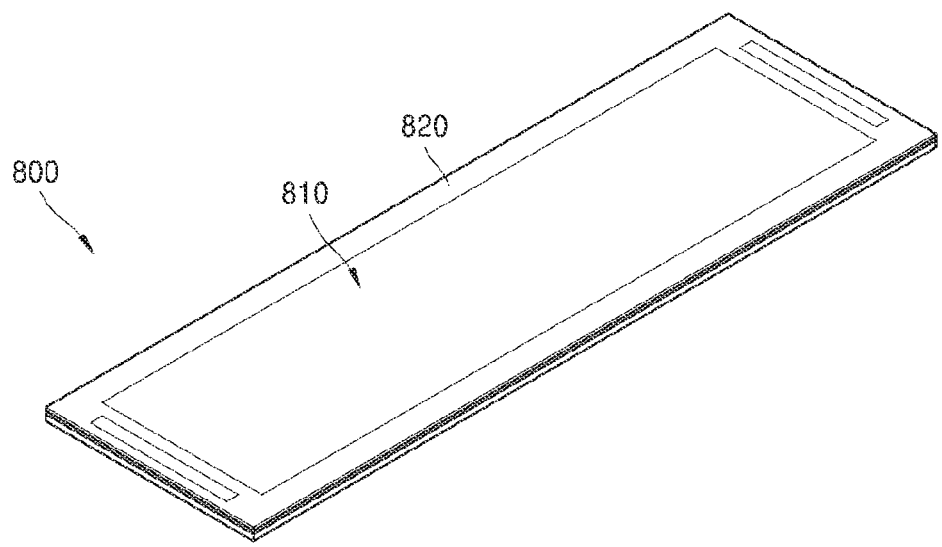
FIG. 8 is a perspective view of a spreading state of an organic light-emitting display apparatus according to one or more exemplary embodiments.
Figure 9:
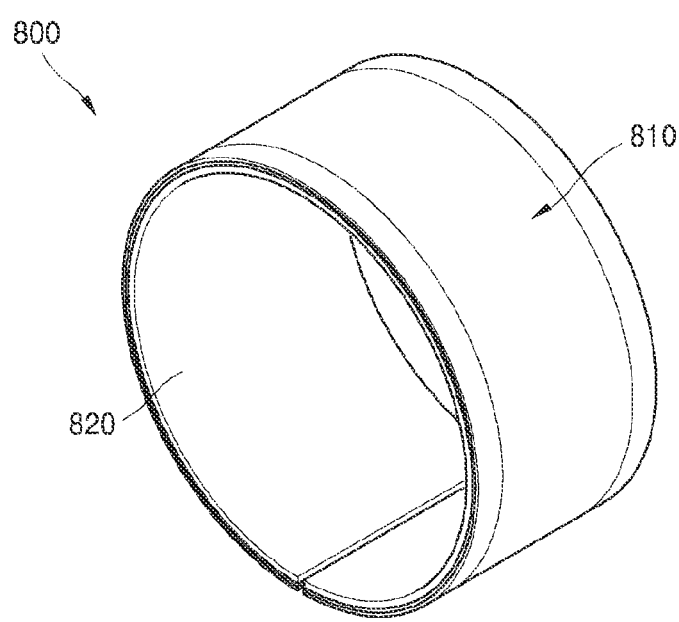
FIG. 9 is a perspective view of a bending state of the organic light-emitting display apparatus of FIG. 8 according to one or more exemplary embodiments.

FIG. 8 is a perspective view of a spreading state of an organic light-emitting display apparatus according to one or more exemplary embodiments. FIG. 9 is a perspective view of a bending state of the organic light-emitting display apparatus of FIG. 8 according to one or more exemplary embodiments.

Referring to FIGS. 8 and 9, the organic light-emitting display apparatus 800 may include a flexible display panel 810 to display an image and a flexible case 820 assembled with the flexible display panel 810. The flexible display panel 810 may include one or more pixels to generate an image, and various panels (e.g., a touch screen), a polarizing plate, and a window cover. The image may be seen at various angles in the spreading or bending state of the organic light-emitting display apparatus 800.

In one or more exemplary embodiments, the organic light-emitting display apparatus 800 is described as an organic light-emitting display apparatus having flexibility. However, the organic light-emitting display apparatus 800 may be a rigid organic light-emitting display apparatus.

Figure 10:
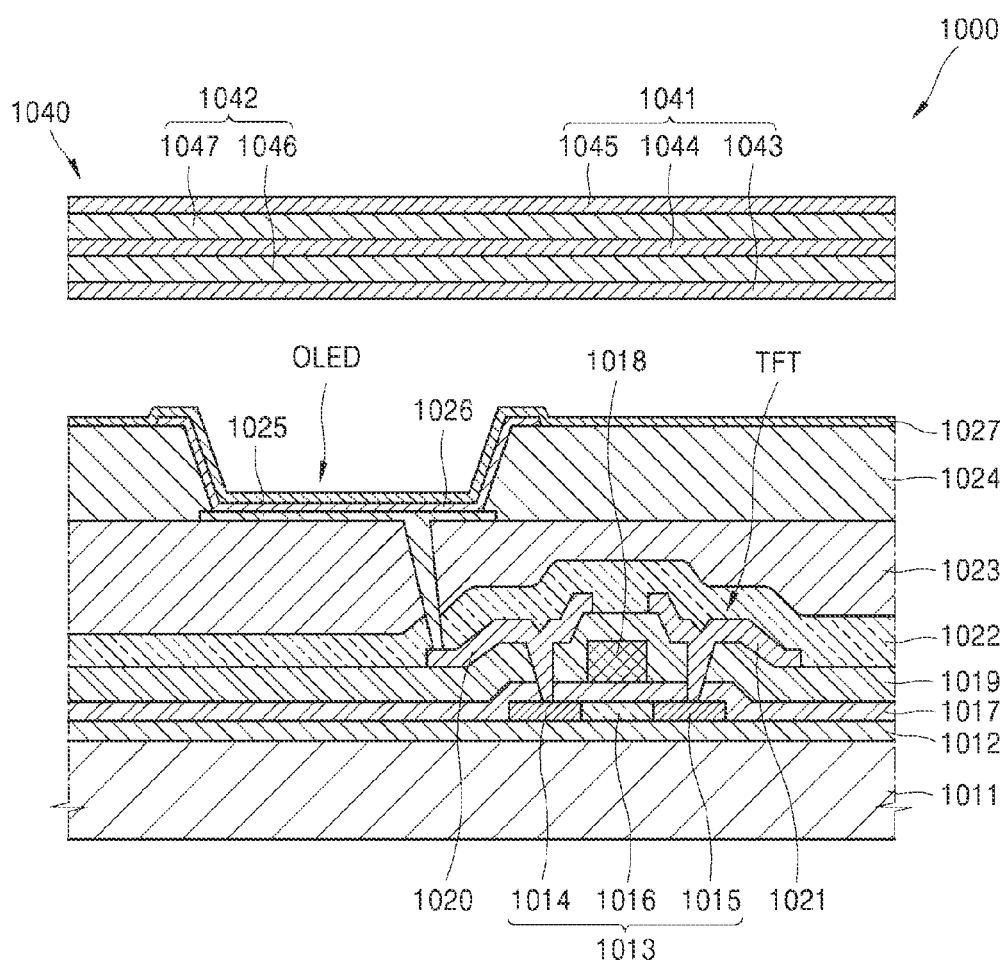
FIG. 10 is a cross-sectional view illustrating a pixel of an organic light-emitting display apparatus according to one or more exemplary embodiments.

FIG. 10 is a cross-sectional view illustrating a pixel of an organic light-emitting display apparatus according to one or more exemplary embodiments. Referring to FIG. 10, the organic light-emitting display apparatus 1000 may include a substrate 1011 and an encapsulation 1040 of a thin layer disposed to face the substrate 1011.

The substrate 1011 may include a barrier layer 1012 formed thereon. The barrier layer 1012 may cover an entire upper surface of the substrate 1011. The barrier layer 1012 may include at least one of an inorganic material and an organic material. The barrier layer 1012 may include a single layer or multiple layers. The barrier layer 1012 may block oxygen and moisture and flatten the upper surface of the substrate 1011.

A thin film transistor (TFT) may be formed on the barrier layer 1012. In one or more exemplary embodiments, the TFT includes a top gate transistor. However, the TFT may include a different type of the thin film transistor (e.g., a bottom gate transistor).

A semiconductor active layer 1013 may be formed on the barrier layer 1012. The semiconductor active layer 1013 may include a source area 1014 formed by doping an N-type impurity ion or a P-type impurity ion, and a drain area 1015. A channel area 1016 may be disposed between the source area 1014 and the drain area 1015. The semiconductor active layer 1013 may include an organic semiconductor, an inorganic semiconductor, and/or amorphous silicon. In one or more exemplary embodiments, the semiconductor active layer 1013 includes an oxide semiconductor.

A gate insulation layer 1017 may be deposited on the semiconductor active layer 1013. The gate insulation layer 1017 may include an inorganic layer. The gate insulation layer 1017 may include a single layer or multiple layers.

A gate electrode 1018 may be formed on the gate insulation layer 1017. The gate electrode 1018 may include a metal with conductivity. The gate electrode 1018 may include a single layer or multiple layers.

An interlayer insulation layer 1019 may be formed on the gate electrode 1018. The interlayer insulation layer 1019 may include at least one of an inorganic layer and an organic layer.

A source electrode 1020 and a drain electrode 1021 may be formed on the interlayer insulation layer 1019. In addition, contact holes may be formed by removing portions of the gate insulation layer 1017 and the interlayer insulation layer 1019. The source electrode 1020 may be electrically connected to the source area 1014 through a contact hole. Similarly, the drain electrode 1021 may also be electrically connected to the drain area 1015 through a contact hole.

A passivation layer 1022 may be formed on the source electrode 1020 and the drain electrode 1021. The passivation layer 1022 may include at least one of an inorganic layer and an organic layer. A planarization layer 1023 may be formed on the passivation layer 1022. The planarization layer 1023 may include an organic layer. It is contemplated that one of the passivation layer 1022 and the planarization layer 1023 may be omitted from the organic light-emitting display apparatus 1000.

The thin film transistor may be electrically connected to the OLED. The OLED may be formed on the planarization layer 1023. The OLED may include a first electrode 1025, an intermediate layer 1026, and a second electrode 1027.

The first electrode 1025 may function as an anode and may include at least one of various conductive elements. The first electrode 1025 may be a transparent electrode or, a reflective type electrode. For example, when the first electrode 1025 is the transparent electrode, the first electrode 1025 may include a transparent conductive layer. When the first electrode 1025 is the reflective type electrode, the first electrode 1025 may include a reflective layer and a transparent conductive layer formed on the reflective layer.

A pixel defining layer 1024 may cover the planarization layer 1023 and the portion of the first electrode 1025. The pixel defining layer 1024 may define a light-emitting area of each sub-pixel by surrounding an edge portion of the first electrode 1025. The first electrode 1025 may be formed by patterning in each sub-pixel.

The pixel defining layer 1024 may include at least one of an organic layer and an inorganic layer. The pixel layer 1024 may include a single layer or multiple layers.

The intermediate layer 1026 may be formed on the first electrode in an area exposed by etching a portion of the pixel defining layer 1024. In one or more exemplary embodiments, the intermediate layer 1026 may be formed by a deposition process. The intermediate layer 1026 may be patterned by using the laser mask 119 formed according to the laser mask system 120 of FIG. 1.

The intermediate layer 1026 may include an organic light emissive layer. In an alternative example, the intermediate layer 1026 may include a light emissive layer and at least one of a hole injection layer (HIL), a hole transport layer (HTL), an electron transport layer (ETL), and an electron injection layer (EIL). However, exemplary embodiments are not limited to the structure described above. For example, the intermediate layer 1026 may include the emissive layer and at least one of various functional layers.

The second electrode 1027 may be formed on the intermediate layer 1026. The second electrode 1027 may function as a cathode. The second electrode 1027 may be a transparent electrode or a reflective type electrode. For example, when the second electrode 1027 is the transparent electrode, the second electrode 1027 may include a metal layer and a transparent conductive layer formed on the metal layer. When the second electrode 1027 is the reflective type electrode, the second electrode 1027 may include a metal layer.

In one or more exemplary embodiments, sub-pixels may be formed on the substrate 1011 and each sub-pixel may emit red, green, blue, or white light. However, exemplary embodiments include sub-pixels to emit any color of light. For example, a subpixel may emit cyan, yellow, teal, or any other color.

In one or more exemplary embodiments, the intermediate layer 102 may be commonly formed on the first electrode regardless of a location of the sub-pixel. The organic light emissive layer may be formed by stacking red, green, and blue light-emitting materials in a vertical direction, or by mixing the red, green, and blue light-emitting materials.

In one or more exemplary embodiments, it is possible to have a combination of different colors from the above-described colors if the combination emits the white color light. A color converting layer or a color filter to convert the emitted white color light into a color may be further included to aid that effect.

The encapsulation 1040 may be formed to protect the OLED from external moisture or oxygen. In one or more exemplary embodiments, the encapsulation 1040 may be formed by alternately stacking an inorganic layer 1041 and an organic layer 1042. For example, the inorganic layer 1041 may include a first inorganic layer 1043, a second inorganic layer 1044, and a third inorganic layer 1045. The organic layer 1042 may include a first organic layer 1046 and a second organic layer 1047.

Figure 11:
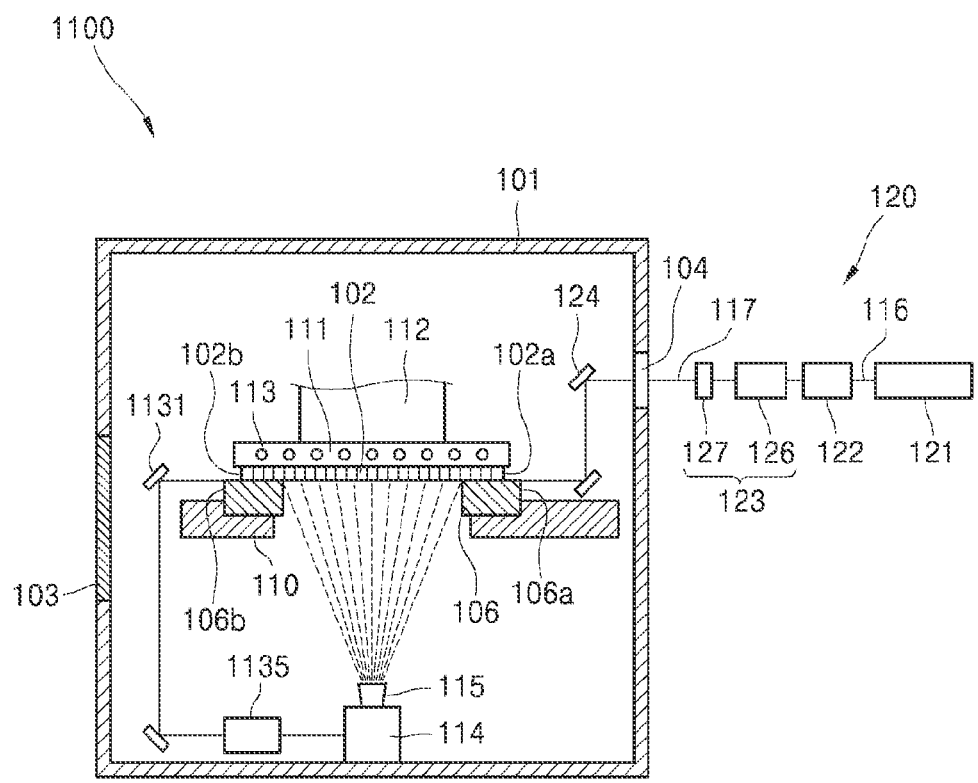
FIG. 11 is a view of an evaporation device according to one or more exemplary embodiments.

FIG. 11 is a view of an evaporation device for an organic light-emitting display apparatus according to one or more exemplary embodiments. FIG. 11 is substantially similar to FIG. 1, except the FIG. 11 illustrates a the laser light being redirected on to the crucible to heat the crucible instead of using the absorber a laser-absorbing system 130 and the second chamber window 105 of FIG. 1. For brevity and clarity, the description of FIG. 11 will focus on the differences between FIGS. 1 and 11.

FIG. 11 illustrated a crucible preheating system. As shown in FIG. 11, the multiple laser beams 117 may form a laser mask 109 (see FIGS. 3 and 4) as described above. Similar to FIG. 1, the multiple laser beams 117 may pass between the substrate 102 and the substrate stage 106 and may proceed from the first side 102a of the substrate 102 to the second side 102b of the substrate 102 due to the redirection of the multiple laser beams 117 from the mirrors 124. Although the mirrors 124 are shown in the chamber 101, it is contemplated that the mirrors 124 may be disposed outside the chamber to avoid temperature dependent aberrations associated with the redirection of the multiple laser beams 117. In one or more exemplary embodiments, an entire width of the multiple laser beams 117 may correspond to a width of the deposition area of the substrate 102.

The multiple laser beams 117 may be directed toward the crucible 114 by mirrors 1131 after passing through one or more optical elements 1135. For instance, the path of the multiple laser beams 117 having passed between the substrate 102 and the substrate stage 106 may be directed by the mirrors 1131. The multiple laser beams 117 may propagate toward one or more optical elements 1135 to change the pattern of the multiple laser beams 117 before the multiple laser beams 117 contact the crucible 114. The one or more optical elements 1135 may change the pattern of the laser beams such that temperature hot spots are avoided on the crucible. The one or more optical elements my change the pattern of the multiple laser beams 117 based on instructions from a controller (not shown). The controller may alter the one or more optical elements based on the actual temperature and the set temperature of the crucible. Alternatively or additionally an heat resistant absorber could be disposed on the crucible to absorb some or all of the multiple laser beams 117. Focusing and directing some or all of the multiple laser beams 117 may lower the cost of heating the deposition material. For example, the multiple laser beams 117 may preheat the crucible prior to the deposition process.

As described above, according to one or more exemplary embodiments, because a deposition device for an organic light-emitting display apparatus and a method using the same may use a laser mask to form a thin layer such as an organic light-emitting layer, it is not necessary to manufacture a mask assembly formed with a metal plate. Accordingly, manufacturing costs of the mask assembly are lowered, manufacturing costs required for using a welding apparatus are lowered, space to store the mask assembly is not needed, and washing process and equipment are not needed.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A deposition device, comprising:
a chamber configured to accommodate a substrate supported on a stage;
a deposition source configured to discharge material toward the substrate; and
a laser mask system configured to form a laser mask between the substrate and the stage to mask a portion of the substrate from discharged material via one or more laser beams.

2. The deposition device of claim 1, wherein the laser mask system comprises:
a laser source configured to emit a first laser beam;
a multi-beam generator configured to split the first laser beam into multiple laser beams, the multiple laser beams comprising the one or more laser beams;
a lens unit configured to direct paths of the multiple laser beams; and
mirrors configured to redirect paths of the multiple laser beams to form the laser mask.

3. The deposition device of claim 2, wherein the multi-beam generator comprises a diffraction grating configured to diffract the first laser beam into the multiple laser beams.

4. The deposition device of claim 2, wherein the lens unit comprises an arrangement of lenses configured to focus and redirect the multiple laser beams to parallel paths.

5. The deposition device of claim 2, wherein the laser mask is formed by the propagation of the multiple laser beams between the substrate and the stage.

6. The deposition device of claim 5, wherein:
the multiple laser beams propagate from a first side of the substrate to a second side of the substrate; and
a width of the multiple laser beams corresponds to a width of a deposition area on the substrate.

7. The deposition device of claim 5, wherein:
a pattern of the laser mask comprises a stripe formation of the multiple laser beams; and
a space between stripes of the stripe formation corresponds to a deposition area on the substrate.

8. The deposition device of claim 2, wherein:
the laser mask system comprises multiple laser sources; and
the laser mask is formed according to propagation of multiple laser beams from the multiple sources.

9. The deposition device of claim 8, wherein the mirrors are configured to cross paths of at least some of the multiple laser beams between the substrate and the stage.

10. The deposition device of claim 9, wherein:
a pattern of the laser mask comprises a mesh formation of the multiple laser beams; and
a space in the mesh formation corresponds to a deposition area on the substrate.

11. The deposition device of claim 2, wherein:
the substrate is spaced apart from the stage to form a propagation space; and
the laser mask system is configured to form the laser mask in the propagation space.

12. The deposition device of claim 11, wherein the propagation space corresponds to a groove formed in a surface of the stage, the surface facing the substrate.

13. The deposition device of claim 12, wherein:
the groove extends from a first side of the substrate to a second side of the substrate, the second side opposing the first side; and
a dimension of the groove between the first side of the substrate and the second side of the substrate corresponds to a dimension of the laser mask.

14. The deposition device of claim 1, further comprising:
a laser-absorbing system configured to absorb laser propagation associated with the formation of the laser mask, wherein the laser-absorbing system comprises:
a laser-absorber configured to receive the laser propagation; and
mirrors configured to direct a path of the laser propagation to the laser-absorber; and
wherein the laser-absorber comprises:
a housing;
an absorber supported by the housing, the absorber configured to absorb the laser propagation; and
a cooling portion configured to cool the housing.

15. The deposition device of claim 2, further comprising:
a deposition source preheating system configured to preheat the deposition source with energy from the multiple laser beams, the deposition source preheating system comprising:
- an optical element configured to change the pattern of the multiple laser beams; and
- mirrors configured to direct a path of laser beam propagation through the optical element to the deposition source, wherein the optical element is configured to change the pattern of the multiple laser beams to reduce hot spot generation associated with laser beam incidence on the deposition source.

16. A method, comprising:
causing, at least in part, a laser mask to be formed between a substrate and a stage in a deposition chamber, the stage supporting the substrate; and
causing, at least in part, a deposition material to be discharged from a deposition source toward the substrate,
wherein the deposition material is deposited on a first portion of the substrate according to a configuration of the laser mask, the configuration comprising a laser beam configured to mask a second portion of the substrate from the deposition material.

17. The method of claim 16, wherein formation of the laser mask comprises:
causing, at least in part, one or more first laser beams to be split into multiple laser beams, the multiple laser beams comprising the laser beam;
causing, at least in part, the multiple laser beams to be focused; and
causing, at least in part, the focused multiple laser beams to propagate over a deposition area on the substrate.

18. The method of claim 17, wherein:
the focused multiple laser beams propagate from a first side of the substrate to a second side of the substrate, the second side opposing the first side; and
the deposition material is deposited in the deposition area according to a space between propagation paths of the multiple laser beams.

19. The method of claim 17, wherein:
some propagation paths of the focused multiple laser beams cross one another; and
the deposition material is deposited in the deposition area according to a space associated with crossing propagation paths of the focused multiple laser beams.

20. The method of claim 16, further comprising:
causing, at least in part, laser propagation associated with formation of the laser mask to be absorbed.

* * * * *